United States Patent
Nautiyal et al.

(10) Patent No.: US 7,433,239 B2
(45) Date of Patent: Oct. 7, 2008

(54) MEMORY WITH REDUCED BITLINE LEAKAGE CURRENT AND METHOD FOR THE SAME

(75) Inventors: Vivek Nautiyal, Uttaranchal (IN); Ashish Kumar, Jharkhand (IN)

(73) Assignee: STMicroelectronics PVT Ltd., Uttar Pradesh (IN)

( * ) Notice: Subject to any disclaimer, the term of this patent is extended or adjusted under 35 U.S.C. 154(b) by 244 days.

(21) Appl. No.: 11/323,953

(22) Filed: Dec. 30, 2005

(65) Prior Publication Data
US 2006/0152965 A1    Jul. 13, 2006

(30) Foreign Application Priority Data
Dec. 31, 2004    (IN)    .................. 2614/DEL/2004

(51) Int. Cl.
*G11C 16/06* (2006.01)
(52) U.S. Cl. ................................. 365/185.23
(58) Field of Classification Search ................ 365/154, 365/189.09, 230.06, 185.07, 185.23
See application file for complete search history.

(56) References Cited
U.S. PATENT DOCUMENTS
6,414,890 B2 * 7/2002 Arimoto et al. ............. 365/201

OTHER PUBLICATIONS

K.R. Kowzlczyk, "Automated cable coupling analysis software for EMC prediction," Publication Date: May 23-25, 1989, IEEE 1989 National Symposium on Electromagnetic Compatibility, On pp. 294-298.*

* cited by examiner

*Primary Examiner*—Son Dinh
*Assistant Examiner*—Harry W Byrne
(74) *Attorney, Agent, or Firm*—Lisa K. Jorgenson; Allen, Dyer, Doppelt, Milbrath & Gilchrist

(57) ABSTRACT

The memory includes a plurality of access transistors with each of the access transistors coupled to one of the wordlines at its control terminal and connected to one of the bitlines at its output terminal. A plurality of memory cells have each output coupled to an input terminal of one of the access transistors so that the access transistors share one of the wordlines and are coupled to different bitlines. A wordline driver coupled to each wordline has the ability of generating a variable voltage at its output responsive to the wordline driver control inputs and voltage at its ground supply node. A plurality of grouped voltage supply lines are coupled to a group of the wordline drivers for inducing a variable reference voltage or ground supply at the ground supply node. A voltage switching logic switches the voltage for the variable ground supply responsive to a ground control input.

20 Claims, 6 Drawing Sheets

US 7,433,239 B2

MEMORY WITH REDUCED BITLINE LEAKAGE CURRENT AND METHOD FOR THE SAME

FIELD OF THE INVENTION

The present invention relates to semiconductor memories, and more particularly to a memory with reduced bitline leakage current and the method for the same.

BACKGROUND OF THE INVENTION

A precharge mechanism is commonly used in typical static memory architectures. For instance, in most high-speed Static Read Access Memory (SRAM) architecture, both the bitlines of the memory are initially precharged to the high voltage level. While reading a location in the memory, one of the wordlines corresponding to the location is selected enabling the access transistor and connecting the bitline to a memory cell. The memory cell storing a low voltage discharges the bitline producing current on the bitline in the process. Based on the current or voltage output of the memory cell, it is sensed by the sense amplifier as a low value stored in the memory.

FIG. 1 shows circuitry for a bit in a conventional memory structure. The circuitry comprises bitlines BIT and BITBAR, memory cells with access transistors and wordlines associated with each memory cell. The two access transistors are coupled to each memory cell on one end and to the common bitlines BIT and BITBAR respectively on the other end. The gate node of access transistor is coupled to the associated wordline. While reading, one wordline is selected and other wordlines are connected to ground through the wordline drivers. The bitline connected to low node discharges through the pull down of selected memory cell while bitline bar is held high. A problem with such setup may arise when memory cells other than the one selected in the column have opposite data values written in them. In this situation, bitline bar discharges through the leakage in the access transistors of these cells, and the worst case is when all other cell of column have opposite data. This may result in erroneous detection of the stored data by the sense amplifier.

As the technology is resulting in smaller semiconductor devices, the leakage current in the access transistors has become a prime concern. The leakage current has become of same order as the current of the devices. The increased leakage current can be attributed to increase in the subthreshold current as technology has moved to deep-sub micron regime. At high temperature, the problem is even more severe and has become a bottleneck for fast and reliable operation of data sensing. The worst case is when one cell is read and the opposite of this cell data is stored in all other cells in the column.

There are some approaches for reducing leakage current such as use of a high threshold transistor, stack access for memory cells, but all these either need modified process or reduce speed due to two access in series. These techniques also result in bigger chip area. Hence there is need for memory with reduced bitline leakage current. At the same time, there is also need for memories that provide reduced complexity and silicon area. There is also need for a memory architecture that does not result in reduced memory speed as a result of leakage current reduction.

SUMMARY OF THE INVENTION

To address the above discussed drawbacks, an object of the instant invention is to provide a memory with reduced bitline leakage.

A further object of the instant invention is to provide a method for reducing bitline leakage current in the memory cells.

Yet another object of the invention is to reduce bitline leakage current in the memory cell without significantly increasing the chip area.

Yet another object of the invention is to provide reduced cell and manufacturing complexity in memories with reduced bitline leakage current.

To meet these and other objectives, a memory is provided with reduced bitline leakage current and includes a plurality of bitlines, a plurality of wordlines, and a plurality of access transistors with each of the access transistors coupled to one of the wordlines at its control terminal and connected to one of the bitlines at its output terminal. A plurality of memory cells have each output coupled to an input terminal of one of the access transistors so that the access transistors coupled to the outputs from one of the memory cells share one of the wordlines and are coupled to different bitlines. A wordline driver is coupled to each wordline with the ability of generating variable voltage at its output responsive to the wordline driver control inputs and voltage at its ground supply node. A plurality of grouped voltage supply lines are coupled to a group of the wordline drivers for inducing a variable reference voltage or ground supply at the ground supply node. A voltage switching logic switches voltage for the variable ground supply responsive to a ground control input.

Further the invention provides a method for reducing bitline leakage current in a memory. The method includes storing data in memory cells of the memory, coupling each output of the memory cells to an access transistor, and connecting outputs of the access transistors to a plurality of bitlines so that the access transistors coupled to the outputs from one of the memory cells share a wordline at their control terminals and are coupled to different said bitlines at their output. The method further includes generating a variable ground supply voltage using a plurality of voltage supply lines and a voltage switching logic responsive to ground control input, connecting the variable ground supply voltage to a wordline driver for generating a variable output for each the wordline driver responsive to wordline driver control inputs, and reducing bitline leakage current for the memory cells by connecting the variable output to the wordline of an access transistor.

To achieve the objective, the present invention provides a memory with reduced leakage currents in memory cells. The invention further provides method of reducing bitline leakage in memory. The invention provides more split at sense amplifier node and hence more speed is given. A negative voltage is generated and applied to the access transistors of unselected wordlines which reduces subthreshold leakage.

BRIEF DESCRIPTION OF THE DRAWINGS

The invention will now be described with reference to and as illustrated in the accompanying drawings.

DETAILED DESCRIPTION OF THE PREFERRED EMBODIMENTS

The present invention provides that while one memory Cell is read, the gate voltage at access transistors of other memory cells coupled to the same bitline is made negative. This is achieved by two independent means which are mutually exclusive but can be combined to have a cumulative advantage. These are: i) Negative voltage generation due to channel Charge Injection; and ii) Generating negative voltage at the reference or ground line of the wordline driver via a coupling effect.

Figure 1:
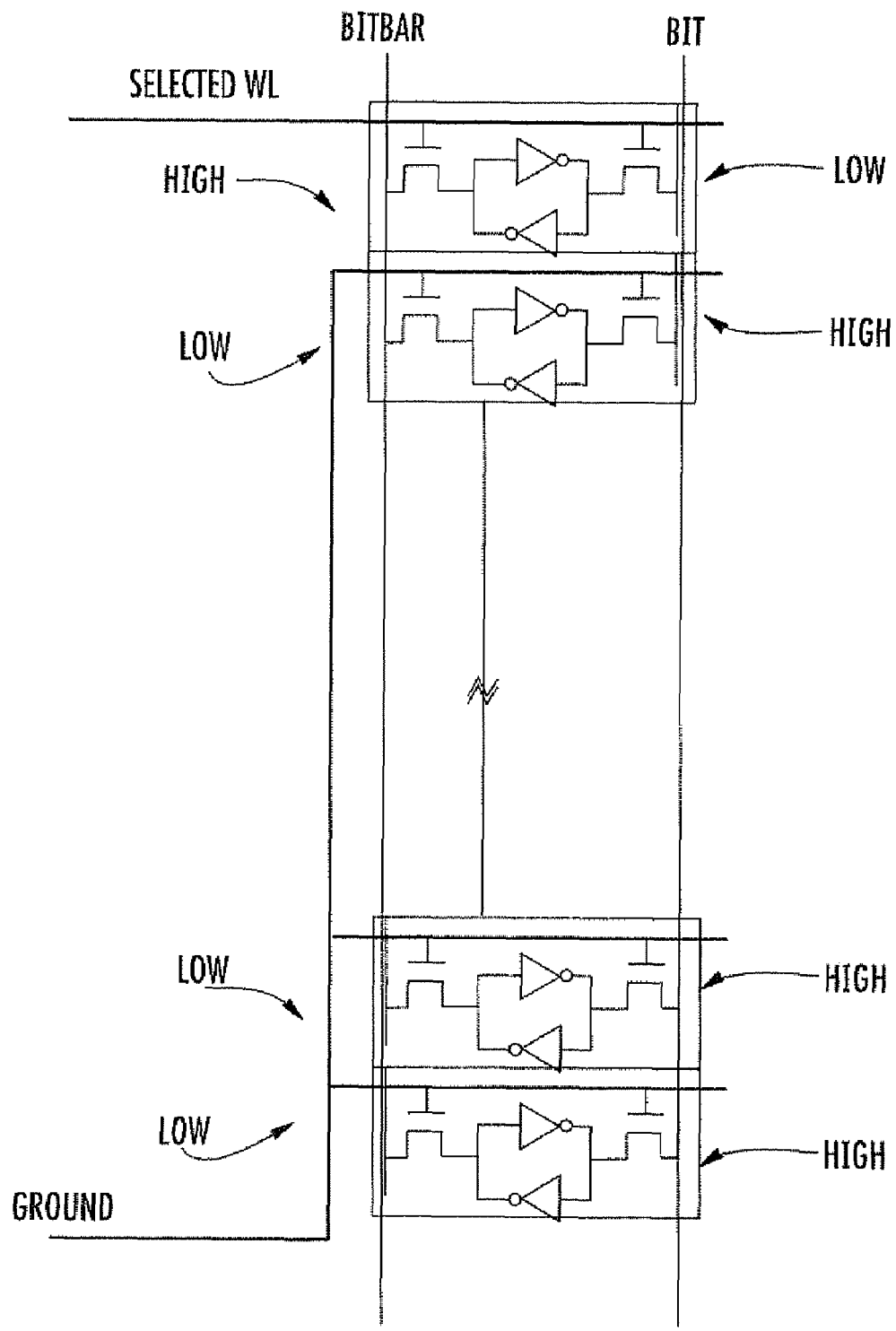
FIG. 1 is a schematic diagram illustrating the prior art SRAM architecture.

In the above mentioned techniques, the wordline driver has a separate ground supply from other circuitry and memory cell arrays. Further, a capacitor can also be provided at the ground line of the wordline driver in a similar fashion as used in FIG. 1 with the pull down transistor of the wordline drivers. The invention thus uses tristate wordline driver, a MOS connected as a capacitor to increase negative voltage generation at the wordline in the circuit of the tristate wordline driver. It includes a switch connected to ground for Wordline drivers and generates negative voltage by inducing coupling in the ground line of the wordline drivers when not selected. It utilizes a minimum distance supply line to induce coupling, and a capacitor at a switch ground line to increase the negative charge at the ground line of the driver and separate the ground line for the wordline drivers.

Figure 3:
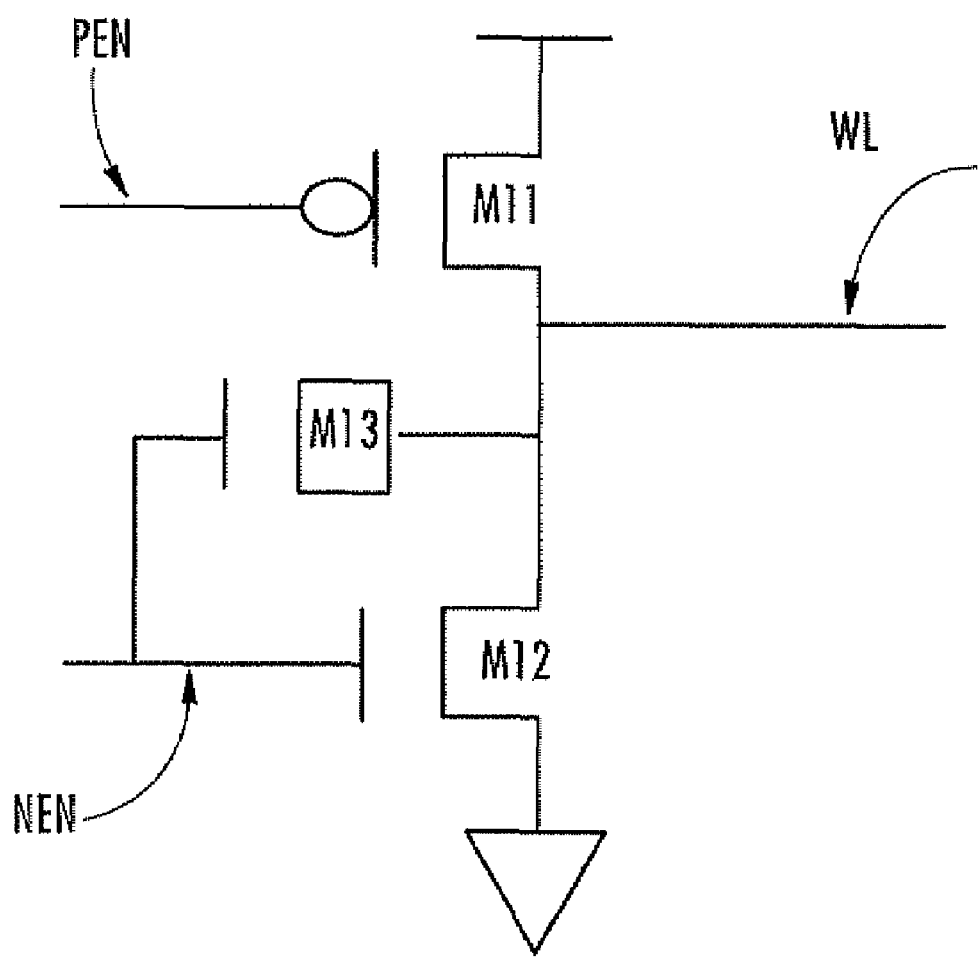
FIG. 3 is a schematic diagram illustrating the wordline driver in accordance with the present invention.

FIG. 3 illustrates the wordline driver which comprises PMOS transistors M11, and NMOS transistors M12 and M13. The source of M11 is connected to supply Vdd, drain is connected to output terminal WL and the gate of M11 is controlled by signal PEN. The source of M12 is connected to ground voltage supply, drain is connected to the output terminal WL and the gate is controlled by signal NEN. NMOS transistor M13 is connected as a capacitor between NEN and WL. Its drain and source are shorted and are connected to the output terminal WL. The substrate of transistor M13 is also connected to WL while the gate is coupled to the NEN signal.

As soon as any memory cell is selected, the NEN of the associated wordline driver is made low. PEN of the wordline to be activated is also made low, activating the desired wordline to the high value. For all other drivers, output terminal WL is tristated and has some negative charge due to the channel charge injection. As soon as NEN is put low, channel charge of transistor M12 is distributed between ground line and unselected wordline. Since capacitance of the wordline is very low as compared to that of the ground line most of the negative charge is distributed to the wordline. Capacitor connected NMOS M13 further boosts this effect by transferring all of its channel charge to the wordline only. The substrate of this capacitor is also connected to WL terminal to transfer all the charge to wordline.

Figure 2:
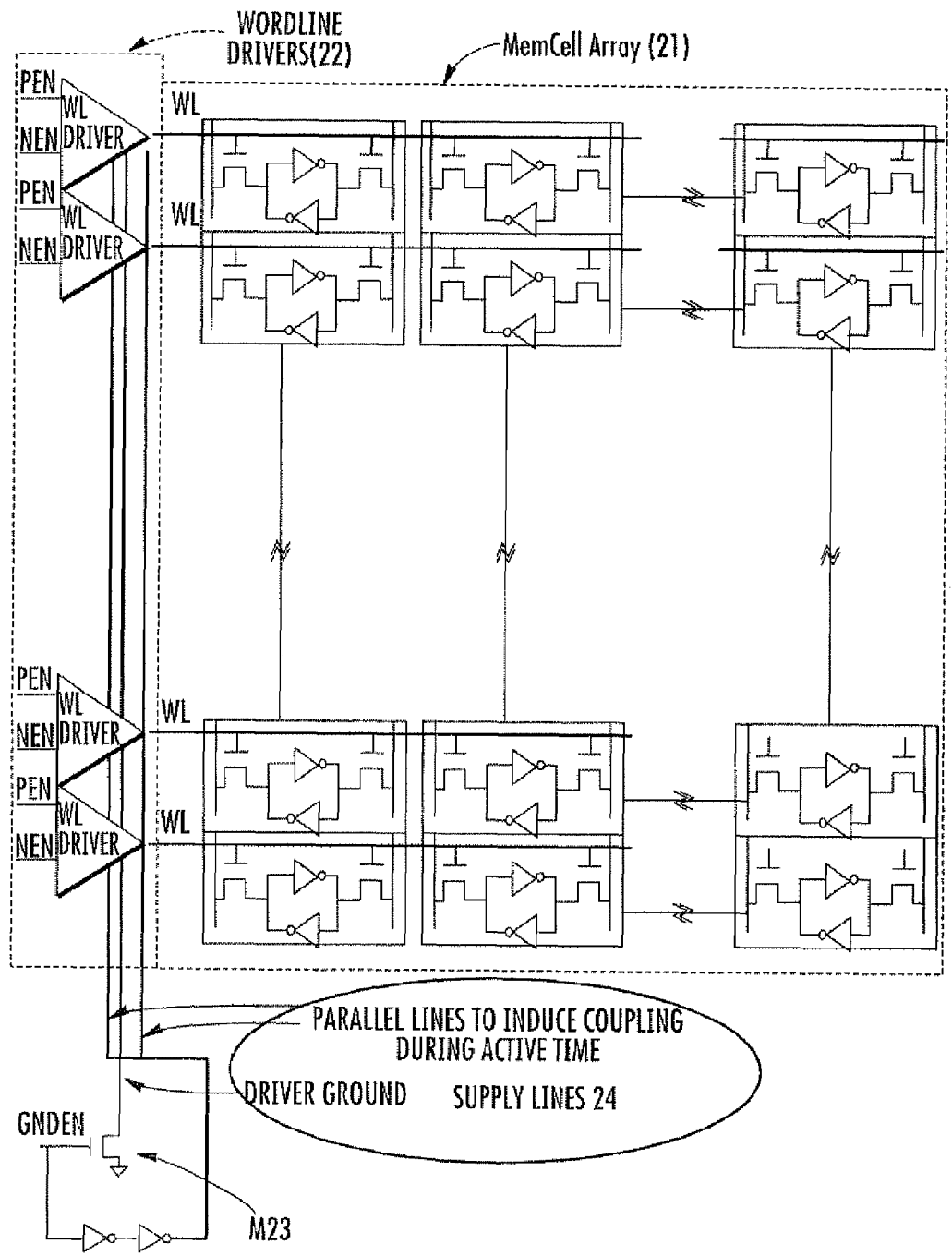
FIG. 2 is a schematic diagram illustrating an embodiment of the memory in accordance with the present invention.

FIG. 2 includes of Memory Cell Array 21, Wordline Drivers 22, NMOS transistor M23, supply line 24. The source of NMOS transistor M23 is connected to the ground supply, and the drain is connected to all the wordline drivers. The ground supply to all the wordline drivers is provided by the NMOS switch, and the gate of NMOS M23 is controlled by GNDEN signal. Supply line 24 includes three parallel lines laid out at minimum distance to have maximum coupling between the lines. The middle wire is a ground line which is surrounded by two wires connected to vdd. When a memory cell is not selected, corresponding GNDEN signal is high providing proper ground to wordline driver of the memory cell. When a memory cell is selected GNDEN is made low, thereby tristating the ground line at the same time switching the surrounding lines from high to low. This switching of surrounding lines generates negative voltage at the ground line which in turn is passed to the unselected wordline.

To have maximum speed advantage with minimum area increase, negative voltage can be created separately for the ground line across the memory cells. The negative voltage can be fed on a group of memory cells where selected memory cell exists. On the other hand, the unselected memory cells can be provided with normal ground.

Figure 4:
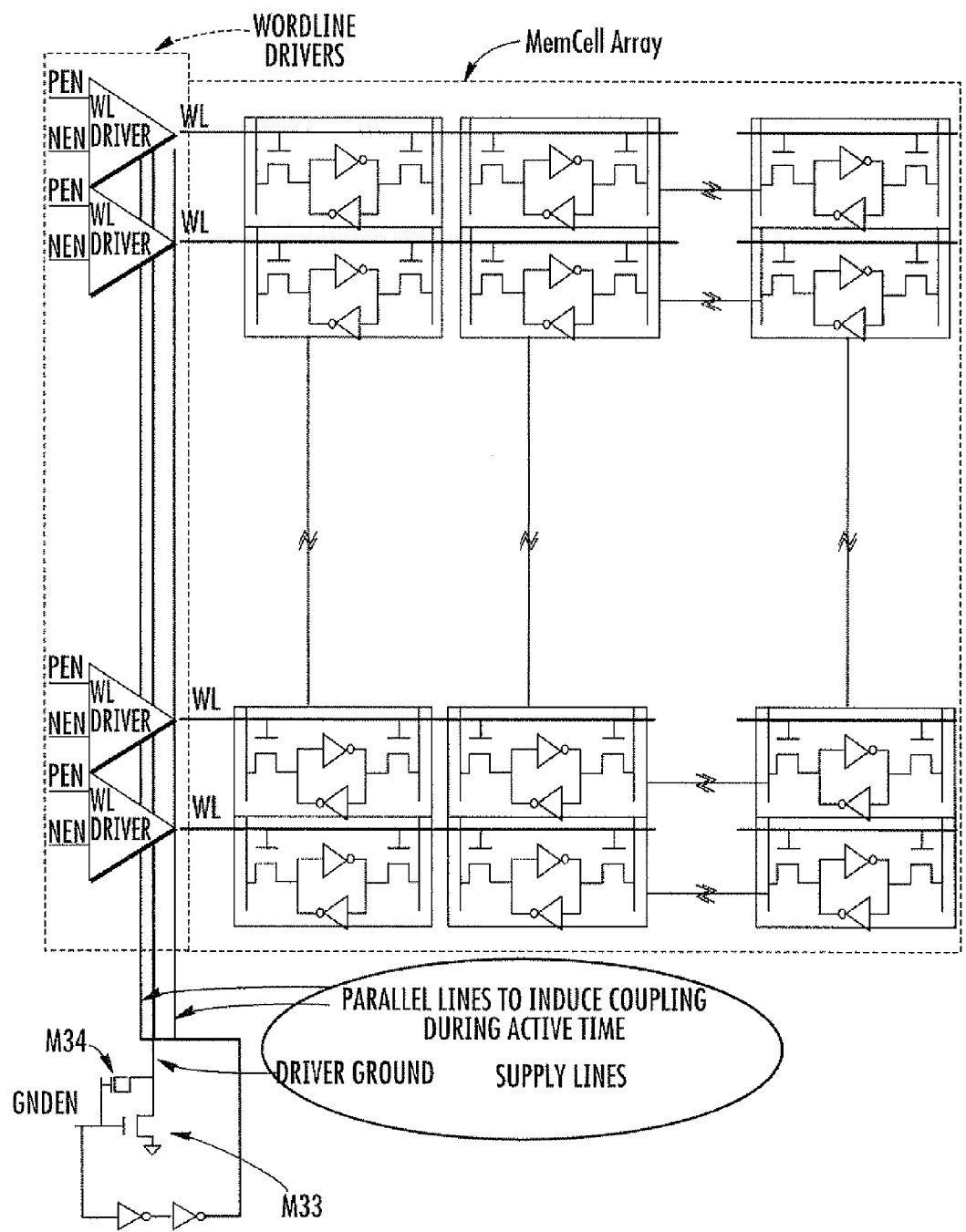
FIG. 4 is a schematic diagram illustrating another embodiment of the memory architecture in accordance with the present invention.

FIG. 4 shows the addition of NMOS M34 connected as a capacitor. Gate is connected to GNDEN, and drain, source, and bulk is connected to the ground line of wordline drivers. When GNDEN is made low negative charge will be generated at ground line due to capacitor M23. To verify the architecture, an array of 512 Rows and 16 columns is taken. Proper value of RC is added in the path of the wordline as well as ground line to driver. The worst case for leakage consideration is made by reading a high value from one of the memory cells while the other 511 cells in the column have a low value stored in them. In the prior art, the ground line of wordline drivers is not switched off during inactive cycles and while reading all other wordlines are at ground level. The architecture uses the following values:

| Driver Size | Pull-up (PMOS) | w = 1e−06 | l = 0.1e−06 |
|---|---|---|---|
| | Pull-down (NMOS) | w = 0.5e−06 | l = 0.1e−06 |
| Supply Voltage | 1.0 v | | |
| Temperature | 125° C. | | |
| Process | 90 NM (TSMC, Typical) | | |
| Ground Line | C = 131.12 fF | R = 181.184 Ohm | |
| Wordline | C = 3.12 fF | R = 4.32 Ohm | |

Figure 5:
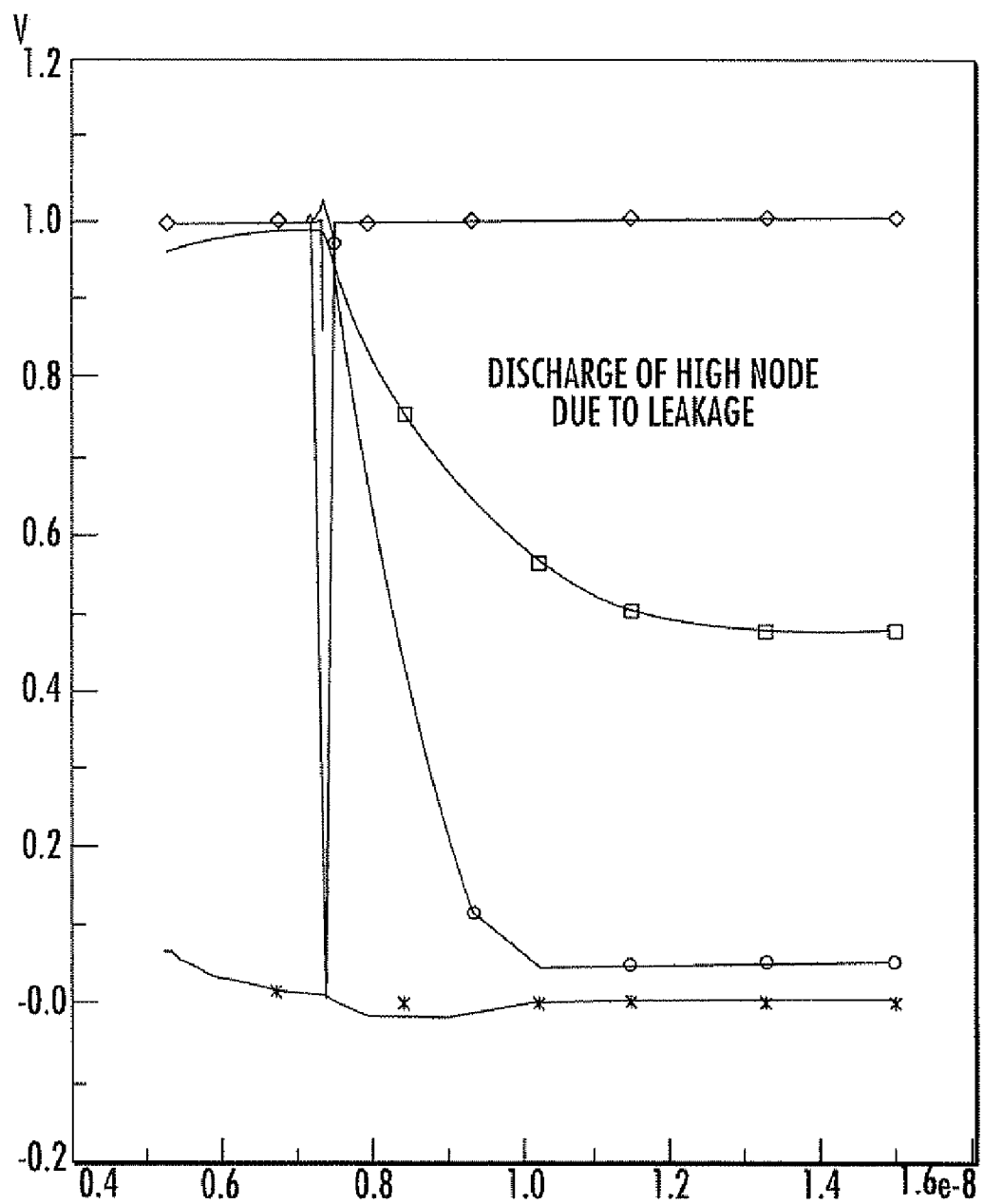
FIG. 5 is a timing diagram showing the simulation results for the prior memory architecture.
Figure 6:
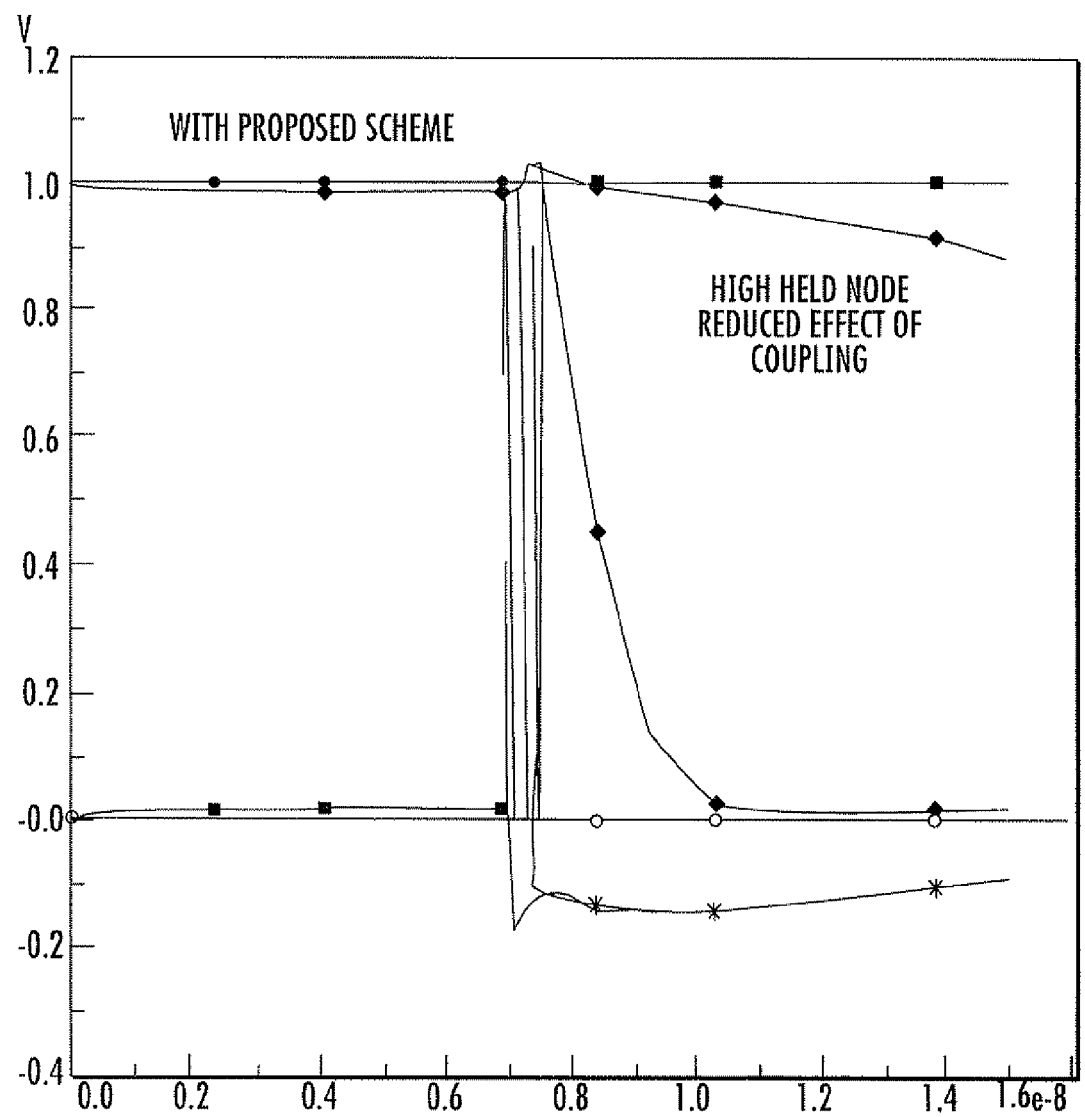
FIG. 6 is a timing diagram showing the simulation results for the memory in accordance with the present invention.

As shown in FIG. 5, the bitline corresponding to high held node is severely affected by the current leakage. FIG. 6 illustrates the results for the present invention. The architecture uses the following values:

| Driver Size | Pull-up (PMOS) | w = 1e−06 | l = 0.1e−06 |
|---|---|---|---|
| | Pull-down (NMOS) | w = 0.5e−06 | l = 0.1e−06 |
| Capacitor (NMOS) | w = 0.4e−06 | l = 0.12e−06 | |
| Supply Voltage | 1.0 v | | |
| Temperature | 125° C. | | |
| Process | 90 NM (TSMC, Typical) | | |
| Ground Line | C = 131.12 fF | R = 181.184 Ohm | |
| Wordline | C = 3.12 fF | R = 4.32 Ohm | |

Two lines are laid out at a minimum distance with the ground line. As shown, the effect of the leakage current is highly reduced. Negative charge is generated at the wordline and the ground of the wordline driver.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an exemplary embodiment thereof, it is the intention of the following claims to encompass and include such changes.

That which is claimed is:

1. A memory with reduced bitline leakage current comprising:
   a plurality of bitlines;
   a plurality of wordlines;
   a plurality of access transistors each having a control terminal coupled to one of the wordlines, and an output terminal coupled to one of the bitlines;
   a plurality of memory cells each having outputs coupled to an input terminal of one of the access transistors so that the access transistors coupled to the outputs from one of the memory cells share one of the wordlines and are coupled to different bitlines;
   a plurality of wordline drivers each being coupled to a respective wordline and generating a variable voltage at an output based upon wordline driver control inputs and a variable reference voltage received at a reference supply node;
   a group of voltage supply lines being coupled to a group of the wordline drivers for inducing the variable reference voltage on the reference supply node; and
   a voltage switching circuit for generating the variable reference voltage in response to a reference control input.

2. The memory as claimed in claim 1 wherein the wordline driver comprises:
   a first N-type transistor having a first terminal coupled to the reference supply node, a second terminal coupled to the output of the wordline driver and a control terminal coupled to a first of the wordline driver control inputs;
   a first P-type transistor having a first terminal coupled to a supply voltage, a second terminal coupled to the output of the wordline driver and a control terminal coupled to a second of the wordline driver control inputs; and
   a first capacitor-coupled N-type transistor with first and second terminals coupled to the output of the wordline driver and a control terminal coupled to the first of the wordline driver control inputs.

3. The memory as claimed in claim 1 wherein the grouped voltage supply lines comprise three parallel supply lines with outer supply lines coupled to the output of the voltage switching circuit, and a middle one of the supply lines coupled to the reference supply node of the wordline drivers.

4. The as claimed in claim 1 wherein the voltage switching circuit comprises:
   a second N-type transistor having a first terminal coupled to a reference voltage supply, a second terminal coupled to the reference supply nodes of the wordline drivers, and a control terminal receiving the reference control input; and
   a set of series-coupled inverters for coupling the reference control input to the output of the voltage switching circuit.

5. The memory as claimed in claim 4 wherein the voltage switching circuit comprises a second capacitor coupled N-type transistor with a control terminal coupled to the reference control input and first and second terminals coupled to the reference supply node.

6. The memory as claimed in claim 1, wherein the supply lines in the grouped voltage supply lines are at a distance sufficient to induce a coupling effect between the supply lines.

7. The memory as claimed in claim 1 wherein the access transistors comprise NMOS transistors.

8. The memory as claimed in claim 1 wherein each of the transistors comprises a MOS transistor.

9. A memory comprising:
   a plurality of bitlines;
   a plurality of wordlines;
   a plurality of access transistors coupled between the wordlines and the bitlines;
   a plurality of memory cells each being coupled to multiple access transistors that share one of the wordlines, and each being coupled to different bitlines;
   a plurality of wordline drivers each being coupled to a respective wordline and receiving wordline driver control input signals, and receiving a variable reference voltage at a reference supply node;
   a group of voltage supply lines each group being coupled to a group of the wordline drivers for inducing the variable reference voltage on the reference supply node; and
   a switching circuit for providing the variable reference voltage.

10. The memory as claimed in claim 9 wherein the wordline driver comprises:
    a first N-type transistor coupled between the reference supply node, the output of the wordline driver and a first of the wordline driver control inputs;
    a first P-type transistor coupled between a supply voltage, the output of the wordline driver and a second of the wordline driver control inputs; and
    a first capacitor-coupled transistor coupled between the output of the wordline driver and the first of the wordline driver control inputs.

11. The memory as claimed in claim 9 wherein the grouped voltage supply lines comprise three parallel supply lines with outer supply lines coupled to the output of the switching circuit, and a middle one of the supply lines coupled to the reference supply node of the wordline drivers.

12. The memory as claimed in claim 9 wherein the switching circuit comprises:
    a second transistor coupled between a reference voltage supply, the reference supply nodes of the wordline drivers, and a reference control input; and
    a set of series-coupled inverters for coupling the reference control input to the output of the switching circuit.

13. The memory as claimed in claim 12 wherein the switching circuit comprises a second capacitor-coupled transistor coupled between the reference control input and the reference supply node.

14. The memory as claimed in claim 9, wherein the supply lines in the grouped voltage supply lines are at a distance sufficient to induce a coupling effect between the supply lines.

15. A method for reducing bitline leakage current in a memory, the method comprising:
    storing data in memory cells of the memory;
    coupling each output of the memory cells to an access transistor;
    coupling outputs of the access transistors to a plurality of bitlines so that the access transistors coupled to the outputs from one of the memory cells share a wordline and are coupled to different bitlines;
    generating a variable reference supply voltage using a group of voltage supply lines and a switching circuit responsive to a reference control input;

coupling the variable reference supply voltage to a wordline driver for generating a variable output for each wordline driver responsive to wordline driver control inputs; and reducing bitline leakage current for the memory cells by coupling the variable output to the wordline of an access transistor.

16. The method as claimed in claim 15 wherein the wordline driver comprises:

a first N-type transistor coupled between a reference supply node, an output of the wordline driver and a first of the wordline driver control inputs;

a first P-type transistor coupled between a supply voltage, the output of the wordline driver and a second of the wordline driver control inputs; and a first capacitor-coupled transistor coupled between the output of the wordline driver and the first of the wordline driver control inputs.

17. The method as claimed in claim 15 wherein the grouped voltage supply lines comprise three parallel supply lines with outer supply lines coupled to the output of the switching circuit, and a middle one of the supply lines coupled to a reference supply node of the wordline drivers.

18. The method as claimed in claim 15 wherein the switching circuit comprises:

a second transistor coupled between a reference voltage supply, the reference supply nodes of the wordline drivers, and the reference control input; and a set of series coupled inverters for coupling the reference control input to the output of the switching circuit.

19. The method as claimed in claim 18 wherein the switching circuit comprises a second capacitor-coupled transistor coupled between the reference control input and the reference supply node.

20. The method as claimed in claim 15, wherein the supply lines in the grouped voltage supply lines are at a distance sufficient to induce a coupling effect between the supply lines.

* * * * *

UNITED STATES PATENT AND TRADEMARK OFFICE
CERTIFICATE OF CORRECTION

PATENT NO. : 7,433,239 B2  Page 1 of 1
APPLICATION NO. : 11/323953
DATED : October 7, 2008
INVENTOR(S) : Vivek Nautiyal and Ashish Kumar It is certified that error appears in the above-identified patent and that said Letters Patent is hereby corrected as shown below:

Column 3, Line 12    Delete: "Cell"
                     Insert: --cell--

Column 3, Line 61    Delete: "of"

Column 5, Line 49    Delete: "The as"
                     Insert: --The memory as--

Signed and Sealed this

Sixth Day of January, 2009

JON W. DUDAS
*Director of the United States Patent and Trademark Office*